United States Patent [19]

Jackson et al.

[11] Patent Number: 4,922,200
[45] Date of Patent: May 1, 1990

[54] APPARATUS FOR MEASURING THE HYSTERESIS LOOP OF MAGNETIC FILM

[75] Inventors: Leon D. Jackson, Bloomfield Hills; Dan O. Morris, Troy; Thomas J. Nagi, Drayton Plains, all of Mich.

[73] Assignee: LDJ Electronics, Inc., Troy, Mich.

[21] Appl. No.: 398,407

[22] Filed: Aug. 25, 1989

[51] Int. Cl.[5] .................. G01R 33/12; G01R 33/14
[52] U.S. Cl. ................................ 324/223; 324/212; 324/262; 356/369
[58] Field of Search .......................... 324/210–212, 324/226, 223, 244, 228, 260, 261, 262; 350/374, 375; 356/369; 360/134, 135

[56] References Cited

U.S. PATENT DOCUMENTS

| | | |
|---|---|---|
| 3,940,688 | 2/1976 | Lazzari et al. |
| 4,213,091 | 7/1980 | Cooper |
| 4,410,277 | 10/1983 | Yamamoto et al. |
| 4,658,148 | 4/1987 | Naito |
| 4,816,761 | 3/1989 | Josephs |

OTHER PUBLICATIONS

Josephs et al, "Magneto–Optic Kerr Effect Hysteresis Loop Measurements on Particulate Recording Media", IEEE Transactions on Magnetics, vol. Mag. 22, No. 5, Sep. 1986, pp. 662–664.

*Primary Examiner*—Reinhard J. Eisenzopf
*Assistant Examiner*—Walter E. Snow
*Attorney, Agent, or Firm*—Harness, Dickey & Pierce

[57] ABSTRACT

A magneto-optic Kerr effect hysteresis loop measuring apparatus is provided which employs a pair of pole-pieces of the same magnetic polarity providing a high and uniform magnetic field strength in the gap between the oppositely disposed faces of the pole-pieces. The spot on the product which is to be nondestructively tested is placed in the gap between the pole-pieces in a region of uniform saturating magnetic field. A laser beam having a high polarization ratio is directed along an incident path with a spot on the surface of the product to be nondestructively tested, and a reflected beam is processed in a Kerr effect detector to provide hysteresis loop data. This data is capable of providing information sufficient to determine the squareness of the hysteresis loop and the coercivity of high coercivity material being nondestructively tested.

19 Claims, 3 Drawing Sheets

APPARATUS FOR MEASURING THE HYSTERESIS LOOP OF MAGNETIC FILM

BACKGROUND OF THE INVENTION

1. Technical Field

This invention relates to an apparatus for testing the magnetic characteristics of magnetic layers of a product and, more particularly, to an apparatus that nondestructively tests these characteristics on both sides of a product simultaneously by saturating the product in a uniform magnetic field.

2. Description of the Prior Art

Apparatus for testing the hysteresis loop of magnetic layers is known. Such commercially available apparatus employ inductive techniques and are commercially known as vibrating sample magnetometers or inductive hysteresis loop tracers. Such devices are well known in the art and require a large electromagnetic field in order to test the sample. The sample is placed in the gap of a large electromagnet thus generally requiring destruction of the product from which the sample was taken.

Magneto-optic Kerr effect apparatus is another form of hysteresis loop testing apparatus presently known. One type of this apparatus also requires that the sample be placed in the gap of a large electromagnet thus requiring that the product be destroyed to create the sample. This type of testing apparatus has been reported in IEEE TRANSACTIONS ON MAGNETICS, VOL. MAG. 22, No. 5, Sept., 1986 at pages 662–664 entitled "Magneto-optic Kerr Effect Hysteresis Loop Measurements on Particulate Recording Media" by Dr. Richard M. Josephs, Dr. Charles S. Krafft and Douglas S. Crompton. In this reference the gap length is described as being 7.6 centimeters, which restricts the size of the sample cut from a product. Thus, this apparatus is generally incapable of nondestructively testing large products such as magnetic recording discs in the gap space or outside the deep gap.

Another magneto-optic Kerr effect method of measuring hysteresis curves is described in U.S. Pat. No. 4,816,761. This device uses an electromagnetic ring magnet with a small gap. Although providing a method of developing a magnetic field for the product being tested, the magnetic field created by the ring magnet is highly nonlinear since the flux lines become less uniform as one progresses away from the gap. As a result, the measurement must generally be taken on a precisely located point very close to the gap in the ring magnet. Because of the extreme nonlinearity of the fringing flux, the field at the point of measurement cannot be calibrated with high accuracy.

Advances in magnetic recording technology are leading to higher and higher coercive forces requiring measuring devices to employ higher magnetization fields. It would be extremely desirable to provide a calibratable and repeatable nondestructive hysteresis loop testing apparatus regardless of the principal employed with a uniform high strength magnetic field. It would also be desirable to be able to test the product with an apparatus that provides a treat deal of latitude as to where the point of measurement needs to be located and, optimally, permits simultaneous measurements on both sides of the product to be tested.

SUMMARY OF THE INVENTION

According to the present invention, there is provided a pair of pole-pieces with the same magnetic polarity each having oppositely disposed faces for generating a high magnetic field strength with a region of uniform flux density. A sample is placed in the gap between the pole-pieces so that the magnetic flux lines substantially and uniformly saturate the magnetic layers to be tested. Since most products have magnetic media on both sides of the substrate, this apparatus can provide a uniform magnetic field that saturates both sides of the sample.

In the preferred embodiment, a polarized beam is directed onto either saturated surface to be tested such that the incident and reflected beams form a plane which is parallel with the direction of the magnetic field lines in the gap. When this polarized beam contacts the surface of the product that is saturated in the uniform magnetic field, the plane of polarization of the beam is rotated through an angle that is proportional to the magnetic characteristics of the sample according to the Kerr effect. Analyzer means is arranged in the reflected path of the laser beam and permits transmission of the reflected beam to a receiver as a function of the Kerr rotation of the beam caused by the magnetic characteristics of the product being tested. The receiver means converts the angular rotation of the plane of polarization to an electrical signal that is used to provide the magnetic characteristics of the spot of the product.

An alternative electromagnetic system can be employed to generate this uniform magnetic field in which the sample is to be tested. In this configuration, two ring magnets, each having a north and south pole, between which is a gap, are aligned so that the north pole on one magnet opposes the north pole on the second magnet, and the south pole on the first magnet opposes the south pole on the second magnet. The gap of the first ring magnet is adjacent to the gap of the second ring magnet and the pole-pieces of the ring magnet are coplanar. The flux lines generated by each ring magnet combine to form a uniform magnetic field between the two magnets. This field is suitable to saturate the sample on both surfaces so that the magnetic characteristics on either side may be tested substantially simultaneously.

DESCRIPTION OF THE PREFERRED EMBODIMENTS

Figure 1:
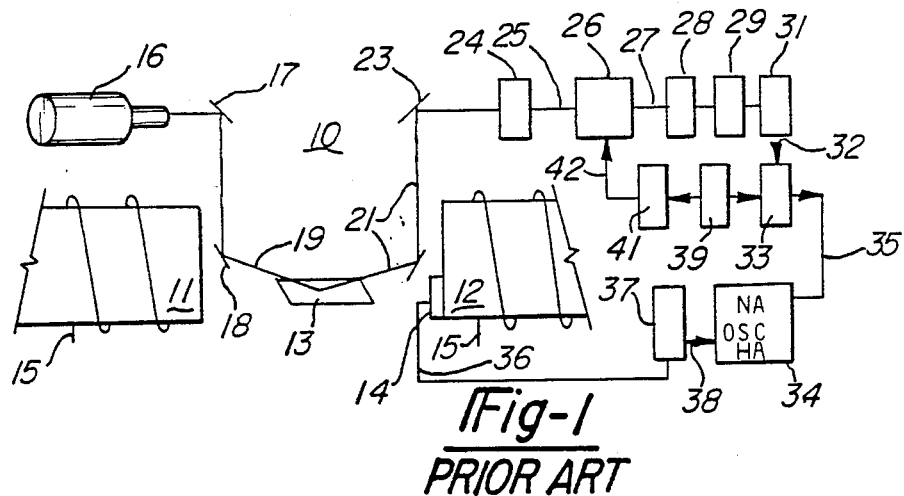
FIG. 1 is a schematic drawing of a PRIOR ART magneto-optic Kerr effect apparatus for destructively testing samples.

FIG. shows a schematic drawing of a PRIOR ART destructive sample testing apparatus 10 as described in the aforementioned IEEE paper which is hereby incorporated by reference. The massive pole-pieces 11 and 12 of a large electromagnet are arranged approximately 3" apart so as to provide ample room for placement of a sample 13 to be tested in the deep gap field there between. A Hall effect magnetic field probe 14 is also placed in the deep gap field. Windings 15 are provided on the pole-pieces 11 and 12 to generate the magnetic field in the gap. A polarized laser beam is provided by laser 16 which is directed to reflecting surfaces 17 and 18 to provide an incident beam 19 which is directed in a direction which is coplanar with the magnetic field direction in the deep gap. The laser beam 21 is reflected from surfaces 22 and 23 onto a Faraday rotator 24 which generates a beam 25 which has its plane of polarization rotated when applied at the input to modulator 26. The laser beam 25 has its plane of polarization modulated by the Faraday modulator 26 so as to produce a laser signal with a time varying polarization direction which can be synchronously detected. The signal 27 coming from the modulator 26 is further processed by analyzer 28, spike filter 29 and detected at detector 31 to produce an A.C. signal on line 32 which is converted to a DC signal by synchronous demodulator 33, then applied to the vertical axis of an oscilloscope or recording means 34 via line 35. The output from the Hall probe 14 on line 36 is applied to a Gaussmeter 37 to produce a field signal on line 38 which is applied to the horizontal axis of the recorder or oscilloscope 34. The signal generator 39 provides an input reference signal to the synchronous demodulator 33 and to the A.C. amplifier 41. The amplified A.C. signal on line 42 drives the Faraday modulator 26.

The PRIOR ART apparatus shown in FIG. 1 is described as employing field strengths up to 2,000 Oersteds but is capable of being driven to approximately 10,000 Oersteds when approximately a hundred amperes is applied to a plurality of turns 15.

Figure 2:
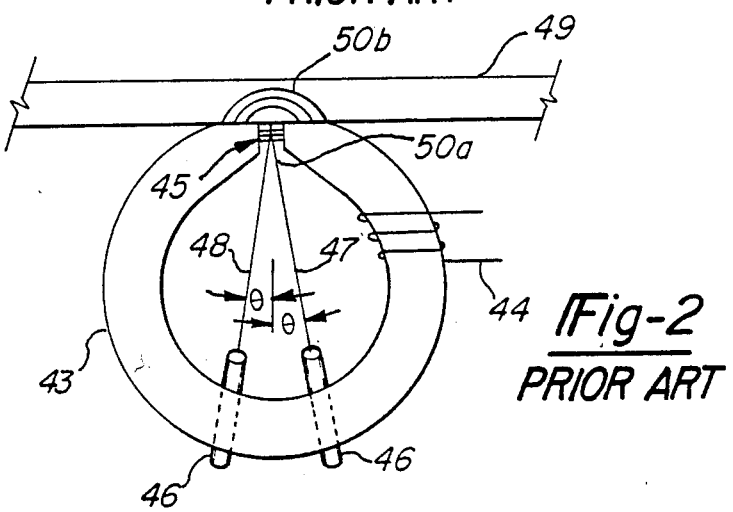
FIG. 2 is a schematic drawing of another PRIOR ART magneto-optic Kerr effect apparatus showing the path of the incident and reflected laser beam from a sample to be tested.

FIG. 2 shows another PRIOR ART method of magneto-optically measuring a thin film as described in U.S. Pat. No. 4,816,761 which is hereby incorporated by reference. FIG. 2 shows a side view of an electromagnetic ring magnet 43 having a large number (typically about 2,000) of turns 44 thereon. The ring magnet 43 is provided with a very small gap 45 of the order of magnitude of ⅛th" length and having a depth of approximately 1/16" so as to produce a magnetic field 50a with field strength of up to 15,000 Oersteds in the depth of the gap 45 known as the deep gap. However, the field 50b in the adjacent external gap will have a much smaller (1/10" to ⅓") and highly nonlinear field strength. Laser and detector support tubes 46 are shown inserted through the walls of the ring magnet 43 and provide a support for the apparatus which produces the incident beam 47 and the reflected beam 48 which form the angle theta with the center line of the magnet as shown.

In FIG. 2, the product to be tested 49 includes a plurality of layers in which the magnetic layer of cobalt nickel is placed face down on the surface of the ring magnet so as to locate the spot being tested at the center line of the gap 45 and also in the external gap field adjacent to the deep gap field. Because the external gap field is nonuniform, it will cause nonuniform magnetic and electrical forces on the product being measured. Since the position of the film with respect to the laser and detector is critical, these forces make the measurement much more difficult. Also, because of the nonuniformity of the magnetic field (decreasing field as the square of the distance from the surface of the ring magnet) and the small size of the gap, it is extremely difficult to accurately calibrate the field at the point of measurement, i.e. where the laser strikes the surface of the product. In most commercial products the magnetic film is deposited on both sides of an aluminum alloy substrate and it is desirable to measure both sides without moving the product. This is not readily possible with this prior art design because the nonuniform field would apply different strengths of magnetic fields to each side of the substrate with the field on the side of the substrate next to the deep gap being about 3 to 10 times stronger than the magnetic field on the side of the substrate opposite the deep gap.

Figure 3:
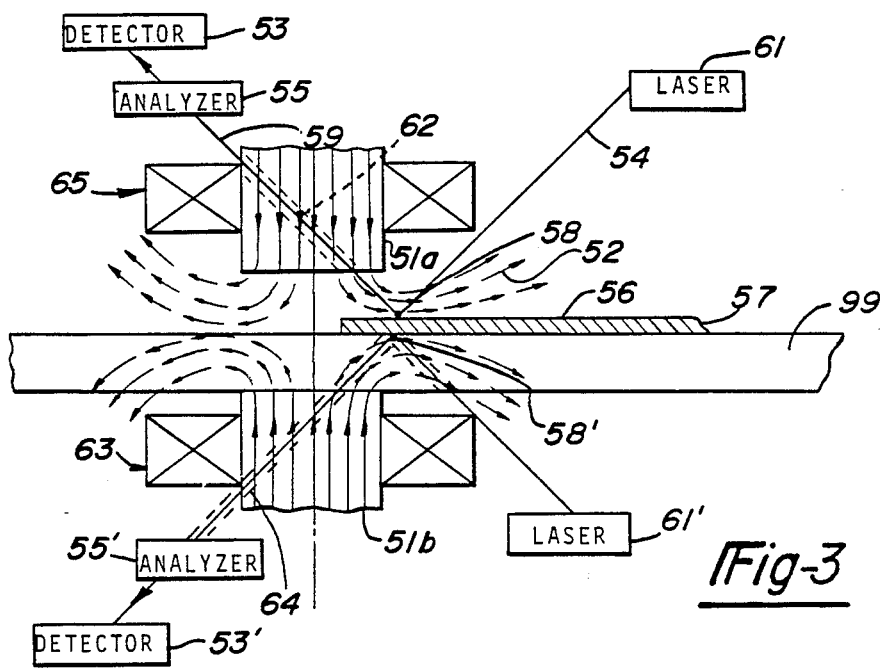
FIG. 3 is a simplified schematic drawing of a magneto-optic Kerr effect apparatus with a pair of pole-pieces of the same magnetic polarity, each having oppositely disposed faces for testing by nondestructive means, made in accordance with the teachings of the present invention, showing the arrangement path of the incident and reflected laser beams from a sample to be tested.

Refer now to FIG. 3. This figure shows an expanded view of the gap area of the preferred embodiment of the present invention. The flux lines 52 (generated by the coils 63 and 65) emanate from each face of the pole-pieces 51a and 51b. Because the flux lines emanate from poles having the same magnetic polarity, the flux lines repel each other and are diverted along a path generally parallel to the faces of the pole-pieces 51a and 51b. The field then becomes high in magnitude and extremely uniform near the circumference of the magnetic poles. A thin film magnetic layer 56 of the sample 57 is then placed between the pole-pieces in the region of uniform magnetic field. The magnetic field generated at each surface of the magnetic thin film will be equal and uniform.

A polarized laser beam 54 is then directed onto either the bottom or top (or both) of the thin magnetic layer 56 by a laser 61. The beam can be polarized in any suitable means such as by using an external polarizing filter or the laser may accomplish polarization internally. The beam 59 reflected from the thin magnetic layer 56 of product 57 is directed to the detector 53. The detector 53 may have a band-pass interference filter for reducing interference from ambient light. The magnetic layer 56 is subjected to the magnetic field 52 that emanates from the pole-pieces 51a and 51b. The polarized beam has a plane of polarization that is angularly rotated in proportion to the change in magnetic intensity at the spot to be tested 58 of the surface 57, thus demonstrating the magneto-optic Kerr effect. After contacting the surface of the product 57, which is supported by support surface 99, the reflected beam 59 is directed through the aperture 62 toward the analyzer 55 where the beam is transmitted to the detector 53 as a function of the Kerr rotation. An additional laser-detector arrangement is shown for testing the other side of the surface.

In the production of hard disks, for computer use, such disks are known to employ cobalt nickel, nickel phosphorous layers on each side of an aluminum substrate. Such hard disks may be removed from the production line, tested on both sides of the disk simultaneously with an accurately calibrated uniform magnetic field and replaced back on the production line within a time frame as to monitor the quality of the production product without destroying the product being tested or interfering with the production line. Since the magnetic field experienced by the thin magnetic layers and aluminum substrate is symmetrical and uniform on both sides of the sample, the nonuniform magnetic and electrical forces created by the prior art techniques are not experienced with this invention.

Figure 4:
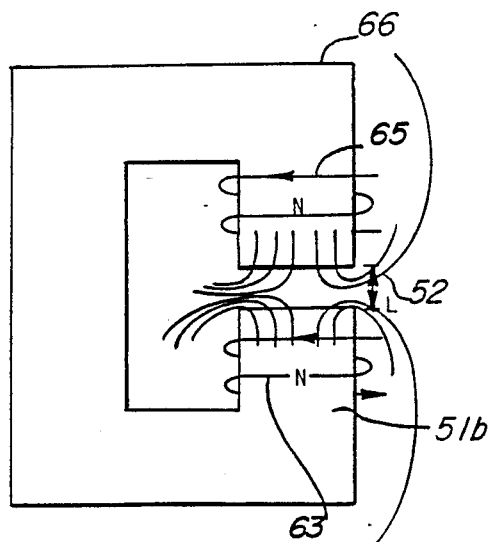
FIG. 4 is a side view of the complete electromagnetic structure showing the electromagnet and its windings.

FIG. 4 is a side view of the apparatus showing the coils 63 and 65 wrapped around the electromagnet 66 and the flux lines 52 coming out of the two oppositely disposed faces of the pole-pieces 51a and 51b.

Figure 5A:
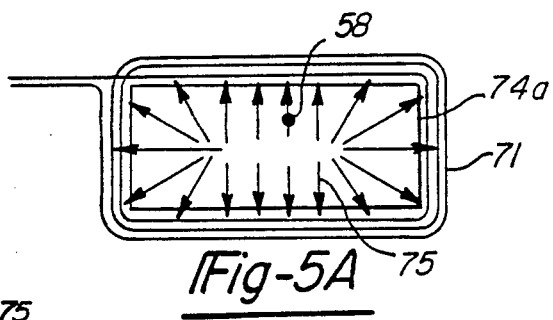
FIG. 5(A) is a cross-sectional view of a rectangular pole-piece of the electromagnet.
Figure 5B:
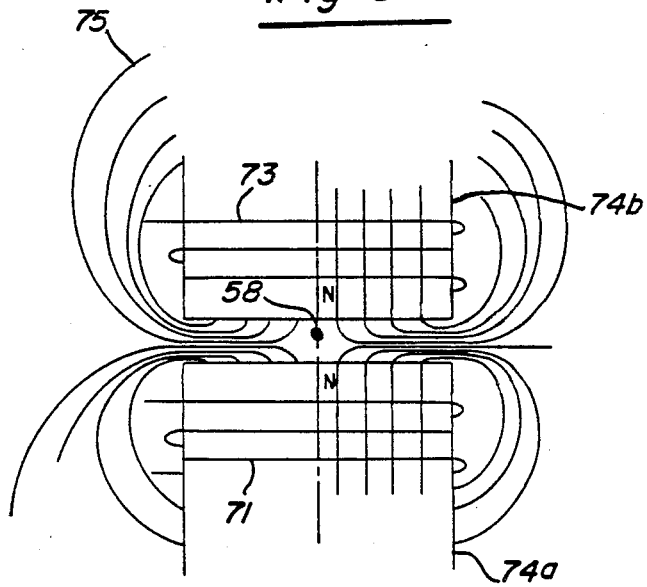
FIG. 5(B) is a side view of the electromagnetic pole-pieces showing the flux lines of the generated magnetic field.
Figure 5C:
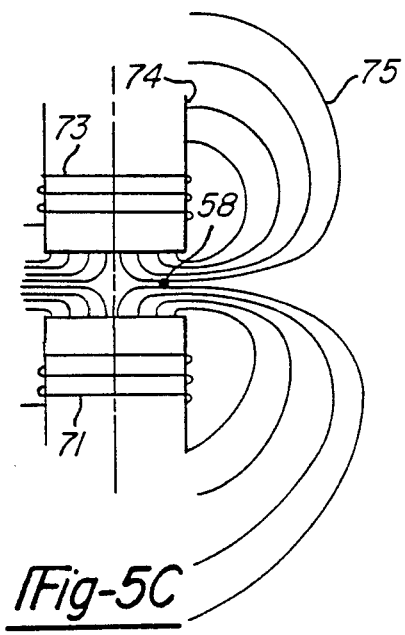
FIG. 5(C) is an end view of the electromagnetic pole-pieces.

FIG. 5A shows a top view of a rectangular pole-piece 74a with windings 71 and the flux lines 75. The spot to be tested 58 is also indicated. FIG. 5B and 5C show the side and end view of the oppositely disposed faces of the pole-pieces 74a and 74b respectively with winding 71 and 73 creating flux lines 75. Also, the spot to be tested 58 is indicated. It is clear from this figure that the spot to be tested 58 is completely immersed in a uniform magnetic field in the gap.

Figure 6:
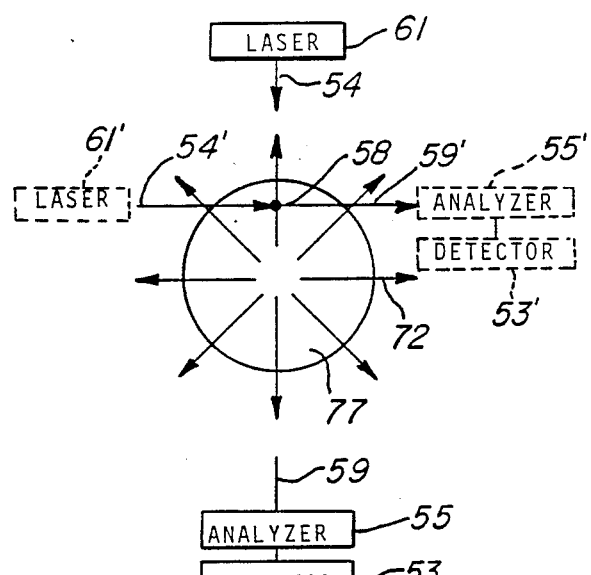
FIG. 6 is a schematic top view of an alternative, round pole-piece showing the magnetic field direction and the laser means arrangement and spot to be tested on the product, along with another possible laser-detector arrangement shown in phantom lines that can measure the transverse Kerr effect.

FIG. 6 shows a top view of a circular pole-piece face 77 and the direction of the magnetic field flux lines 72. From this view it can be readily understood that the laser 61 can direct the incident beam 54 on any spot 58 on the sample such that the incident 54 and reflected 59 beams form a plane that is parallel to the direction of the magnetic field for determining the longitudinal Kerr effect. This arrangement is shown by laser 61, analyzer 55 and detector 53. Also, an alternative laser 61', analyzer 55' and detector 53' arrangement can be formed to measure the transverse Kerr effect. This is accomplished by focussing the incident beam 54' on a spot 58 such that the incident 54' and reflected 59' beams form a plane that is perpendicular to the direction of the magnetic field.

Figure 7A:
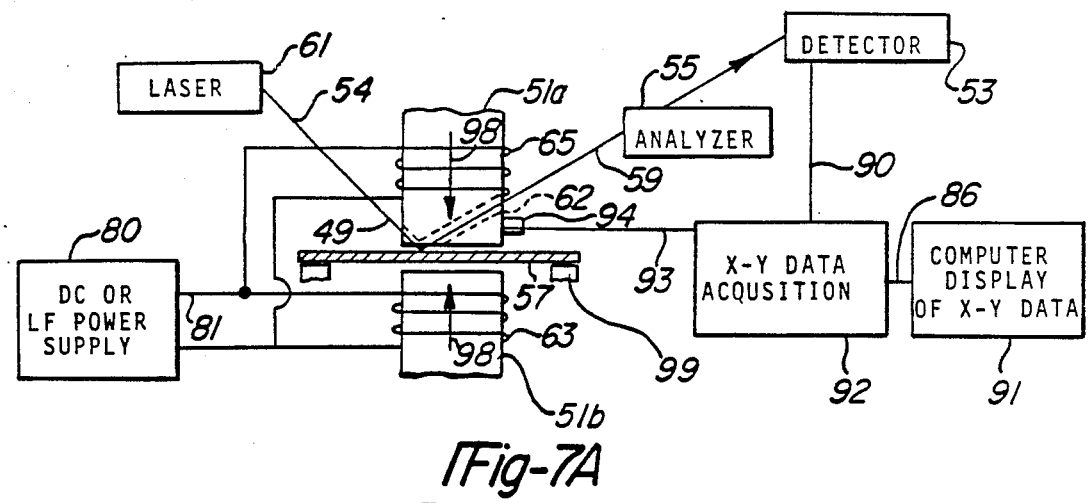
FIG. 7(A) is a side view including a schematic block diagram of the receiver means for performing hysteretic loop measurements in the present invention.

FIG. 7A shows a schematic block diagram of the complete system. The incident 54 and reflected 59 laser beam travels through the aperture 62 in the pole-pieces 51a and 51b. Both the laser 61 and detector 53 are suitably supported to prevent movement of the beam. The plane of polarization of the incident beam is angularly rotated in proportion to the magnet characteristics of the sample to be tested (magneto-optic Kerr effect). The reflected beam passes through an analyzer 55 that transmits the beam as a function of the Kerr rotation so that it can be received by the detector. The detector converts the angular rotation from the polarized beam into an electric signal. The detector supplies this electric signal to the X-Y Data Acquisition means 92 along path 90. The other input to the X-Y Data Acquisition means is supplied by a Hall Probe 94 along path 93. The output from this device is directed along path 86 to the computer display 91 means where the magnetic characteristics of the sample is displayed. The windings 58 are powered by the DC power supply 80 along path 81.

Figure 7B:
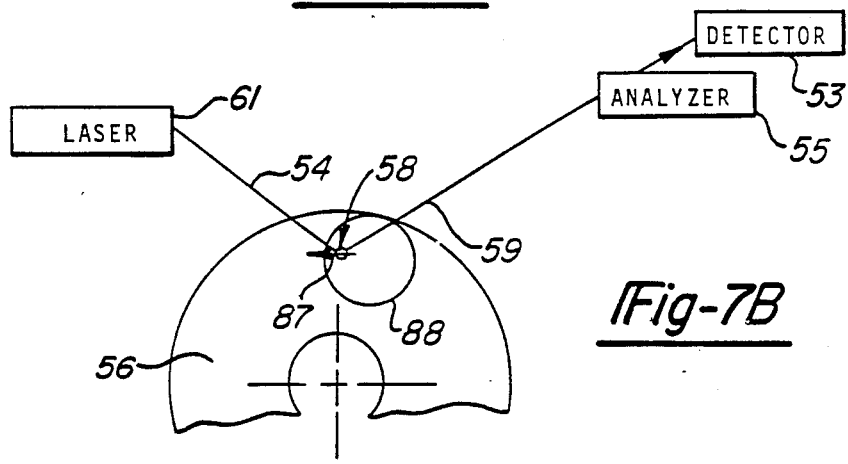
FIG. 7(B) is a top view including a sample product along with a possible arrangement for the laser and detector.

FIG. 7B shows a top view of a sample 56 and circular pole-piece 88 along with a possible configuration of the laser 61, analyzer 55 and detector 53. Along with the spot on the sample to be tested 58 is shown the direction of the magnetic field 87. Testing on a single side of a disk will be improved because of the reduction in magnetic forces and electrical forces created with prior art because of the nonlinear magnetic fields employed. In this configuration, the incident beam 54 hits spot 58 and the reflected beam 59 enters the analyzer 55 demonstrating the longitudinal Kerr effect.

Figure 8:
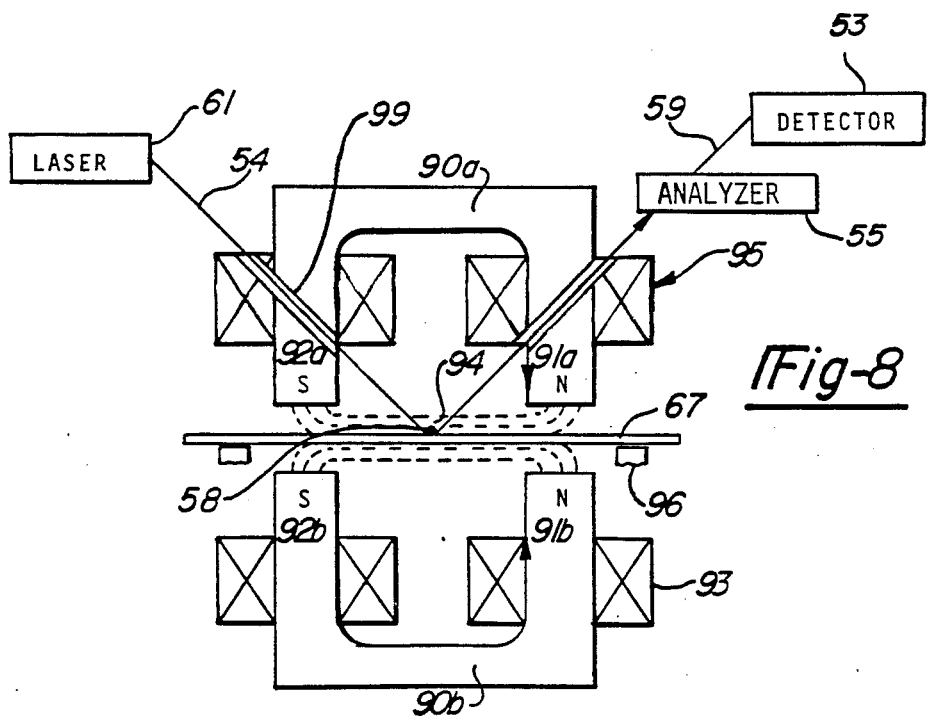
FIG. 8 is an alternative embodiment of the present invention indicating a different way for generating the uniform magnetic field.

FIG. 8 shows an alternative configuration for generating the uniform magnetic field in which the sample to be tested is immersed. A first and second ring magnet 90a and 90b, each having north and south pole-pieces (91a, 92a, 91b and 92b), are situated such that the pole-pieces are coplanar. The first and second windings 93 and 95 have current flowing through them to generate the uniform magnetic field 94 between the magnets that lies in a plane that is orthogonal to the plane formed by the two magnets. The sample to be measured 67 is immersed in this uniform field and supported by supports 96. The same laser 61, analyzer 55 and detector 53 means are used to generate incident 54 and reflected 59 polarized beams that travel through aperture 99 and are used to determine the magnetic characteristics of the sample.

One advantage of this invention is that both surfaces of a sample can be tested substantially simultaneously by generating a uniform magnetic field in which the sample is immersed. As would now be apparent to those skilled in the art, the spot should be located in the gap (i.e., between the planes defined by the pole-pieces) and in the region where the flux lines are parallel to the pole-pieces. Since the field in this region is uniform, there is great latitude in where the spot on the surface can be vertically located within the field. This allows simultaneous testing on both sides of a product quickly and nondestructively. Also, the field is easily calibrated because it is uniform over a relatively large region.

What is claimed is:

1. An apparatus for the nondestructive hysteretic testing of magnetic layers on a surface of a product, said apparatus comprising:

electromagnetic means having a pair of pole-pieces of the same magnetic polarity, each having oppositely disposed faces with a gap therebetween, said electromagnetic means producing a region of uniform flux density with flux lines in the gap running substantially parallel to the faces of the pole-pieces, the flux path having a sufficiently high magnetic field strength to saturate a thin magnetic layer spot on a surface of said product;

supporting means for positioning said spot on the product adjacent the gap;

laser means for directing a high polarization laser beam onto said spot on the product; and receiver means for receiving the beam reflected from the spot and determining the magnetic characteristics of the product as a function thereof.

2. The apparatus of claim 1 which further comprises:
second laser and detector means for substantially simultaneously testing a second spot on the opposite surface of said product.

3. The apparatus of claim 1 wherein said electromagnetic means comprises:

an electromagnet having a body with first and second arm portions terminating at said pole-piece faces; and first and second coils that wrap around first and second arms of the electromagnet.

4. The apparatus of claim 3 wherein electrical current is provided through the windings of the first coil in a direction to create a magnetic field that extends perpendicular to the face of one of the pole-pieces and wherein electrical current is provided through the windings of the second coil in a direction to create a magnetic field that extends perpendicularly to the face of the other pole-piece so that both pole-pieces have the same magnetic polarity thereby creating a uniform magnetic field substantially throughout the gap.

5. The apparatus of claim 3 wherein said magnetic field emanating from each pole-piece is of equal magnitude and generates flux lines in a plane parallel to the faces of the pole-pieces.

6. The apparatus of claim 1 which further comprises:
access aperture means extending through the body of the electromagnet thereby providing a path for said laser beam to and from the spot on the product.

7. The apparatus of claim 6 wherein said access aperture means includes a plurality of independent apertures of at least one for incident laser beam and one for reflected laser beam.

8. The apparatus of claim 1 wherein said supporting means comprises a support surface extending parallel to the face of the pole-piece between the gap on which the product to be tested lies.

9. The apparatus of claim 1 wherein said laser means produces an incident and reflected laser beam that have a plane of polarization, said beams forming a plane of incidence substantially perpendicular to the plane defined by the surface of the product.

10. The apparatus of claim 1 wherein said spot on the product to be tested is placed between the two faces of the pole-pieces.

11. The apparatus of claim 9 wherein said uniform magnetic field rotates the plane of polarization of the polarized light in proportion to the magnetic characteristics of the product.

12. The apparatus of claim 1 wherein said receiver means comprises:
detector means for receiving the reflected beam;
analyzer means for transmitting the reflected beam as a function of the Kerr rotation;
stabilizing means for accurately directing the incident and reflected laser beam;
a Hall probe located adjacent the gap;
X-Y data acquisition means for determining the magnetic characteristics of the product as a function of the magnetic field strength in the gap; and
computer display means for displaying said magnetic characteristics.

13. The apparatus of claim 12 wherein said analyzer means transmit the reflected beam as a function of the Kerr rotation so that it can be detected by the detector.

14. The apparatus of claim 12 wherein said detector means receives the beam of polarized light and converts it into an electrical signal.

15. The apparatus of claim 12 wherein said Hall probe generates the measurement of the magnetic field in the gap and supplies the measurement to the X-Y data acquisition means.

16. The apparatus of claim 12 wherein said X-Y data acquisition means compares the measurement of the magnetic field in the gap to the electric signal received from the detector means to determine the hysteretic loop characteristics of the product.

17. The apparatus of claim 12 wherein said computer display means takes the hysteretic loop characteristics from the X-Y data acquisition means and displays it in a readable output form.

18. The apparatus of claim 1 wherein said electromagnetic means comprises:
two ring magnets each having a north and south pole with a gap therebetween, the ring magnets being arranged so that the north pole of one ring magnet opposes the north pole of the second ring magnet and the south pole of the first ring magnet opposes the south pole of the second ring magnet.

19. The apparatus of claim 18 wherein said two ring magnets are situated such that the gap of the first ring magnet is situated adjacent to the gap of the second ring magnet and the pole faces of the ring magnets are coplanar.

* * * * *